United States Patent [19]

Rees

[11] 3,828,278

[45] Aug. 6, 1974

[54] CONTROL CIRCUIT FOR DISABLING MOS OSCILLATOR

[75] Inventor: Lynn T. Rees, Mesa, Ariz.

[73] Assignee: Motorola, Inc., Chicago, Ill.

[22] Filed: July 13, 1973

[21] Appl. No.: 379,045

[52] U.S. Cl. .............. 331/116 R, 331/185, 58/23 A, 58/23 AC

[51] Int. Cl. .............................................. H03b 5/36

[58] Field of Search................ 331/116 R, 173, 185; 58/23 R, 23 A, 23 BA, 23 AC

[56] References Cited

UNITED STATES PATENTS

| | | | |
|---|---|---|---|
| 3,676,801 | 7/1972 | Musa | 331/116 R |
| 3,745,758 | 7/1973 | Kuritz | 58/23 A |
| 3,745,760 | 7/1973 | Keeler | 58/23 BA |

*Primary Examiner*—Herman Karl Saalbach
*Assistant Examiner*—Siegfried H. Grimm
*Attorney, Agent, or Firm*—Vincent J. Rauner; Maurice J. Jones

[57] ABSTRACT

The oscillator control mechanism renders the active element of an oscillator inoperative in response to the closure and operative in response to the opening of a mechanical or solid state control switch. In addition to the control switch, the mechanism includes solid state feedback and inverter switches which are controlled by signals conducted by the control switch. The inverter switch is rendered conductive and the feedback switch is rendered nonconductive to disable the oscillator. Alternatively, the inverter switch is rendered nonconductive and the feedback switch is rendered conductive to enable the oscillator. The mechanism requires no switches to be connected between the power terminals of the active element and the power supply so that the oscillator can be operated by a power supply voltage of small magnitude.

9 Claims, 4 Drawing Figures

| SWITCH 52 | CONTROL SIGNAL | TRANSMISSION GATE 54 | INVERTER SWITCH 56 | OSC |
|---|---|---|---|---|
| CLOSED | 1 | NON-CONDUCTIVE | CONDUCTIVE | OFF |
| OPEN | 0 | CONDUCTIVE | NON-CONDUCTIVE | ON |

CONTROL CIRCUIT FOR DISABLING MOS OSCILLATOR

CROSS REFERENCE TO RELATED APPLICATION

The subject matter of the present application is related to the subject matter of the patent application entitled, "Digital Power Control Circuit For An Electric Wristwatch", Ser. No. 270,130 filed on July 10, 1972, by R. Gary Daniels and James Walter Foltz and which is assigned to the assignee of the present application.

BACKGROUND OF THE INVENTION

Considerable effort has been directed toward providing a switching arrangement which is capable of turning an oscillator on and off which operates from a low power supply voltage on the order of 1.5 volts. More particularly, modern electronic wristwatch circuits sometimes include an oscillator having a metal oxide semiconductor (MOS) inverter circuit comprised of enhancement mode field effect transistors (FETs) of opposite conductivity types. The gate electrodes of the FETs are connected together to form an inverter input terminal, the source electrodes of the FETs are connected to different power supply potentials, and the drain electrodes are connected together to form an inverter output terminal. A frequency controlling circuit which may include a crystal is connected from the output terminal of the inverter to the input terminal. The MOS oscillator circuit and its MOS load draws significant electrical power from the battery only when the field effect transistors of the oscillator are switched between their conductive and nonconductive states.

The operation of the oscillator circuit and thus the power drawn by the oscillator and its MOS load can be controlled by placing a switch such as either a FET or a mechanical switch in series between the source of one of the inverter MOSFETs and the supply potential. If the switch is rendered conductive, it conducts power to actuate the oscillator and if the switch is rendered nonconductive, it prevents power flow to render the oscillator and its load nonoperative. If the switch is a FET, it may be controlled by external circuitry as disclosed in the aforementioned related patent application.

At low power supply voltages, the foregoing technique is disadvantageous in some applications because when the switch is rendered conductive it provides a slight voltage drop across its source-to-drain or contact terminals which thereby lowers the power supply potential applied to the inverter. This voltage drop which lowers the already low output voltage of a nearly discharged battery, for instance, can sometimes result in an applied voltage which has an insufficient magnitude for reliable operation of the inverter.

Furthermore, it is desirable that the oscillator circuit should be rendered operative when the switch is open rather than when the switch is closed. Generally, power will be applied to the oscillator of an electric wristwatch except before sale of the watch. Hence, the mechanism for supplying power ought to be more reliable than the mechanism for shutting the power off. Since open circuits are more reliable and dependable than closed circuits, it is desirable that an open circuited switch be utilized to enable the oscillator rather than a closed switch.

Another problem of the closed switch-oscillator on mode of operation is that reactances associated with conductors external to the monolithic watch chip which are connected through the closed switch can have deleterious affects on oscillator operation, such as causing its frequency and thus the time indicated by the watch to be unpredictable. This is especially true if the oscillator power supply control is achieved through the closure of a mechanical switch which is connected directly to the active element of the oscillator. Moreover, mechanical switches are generally much more expensive and unreliable than solid state switches.

SUMMARY OF THE INVENTION

One object of this invention is to provide an improved mechanism for activating and inactivating an oscillator circuit.

Another object of the invention is to provide a control mechanism suitable for turning on and turning off a MOS inverter.

Still another object of the invention is to provide a shutdown mechanism for use with an oscillator including an MOS inverter which must operate at a power supply voltage of small magnitude.

A still further object of this invention is to provide an oscillator control mechanism which has a solid state portion suitable for being included in a monolithic chip including an oscillator having an MOS inverter and which has a control switch that is opened to render the inverter operative.

A still additional object of the invention is to provide a MOS oscillator circuit having an operation control circuit and which is suitable for being energized by a power supply providing only two potential levels.

The oscillator circuit to be controlled includes an active element with input, output and power terminals and a feedback circuit connected between the output and input terminals of the active element. A power supply having a voltage of low magnitude provides electrical power through the power terminals of the oscillator circuit. The oscillator control circuit includes a normally conductive transmission gate having input and output terminals interposed in the feedback circuit. The transmission gate is rendered nonconductive in response to a control signal applied to its control terminal to open circuit the feedback path. A normally non conductive inverter switch includes a control terminal, an input terminal coupled to the input terminal of the active element and an output terminal connected to one of the power terminals. The inverter control switch is rendered conductive in response to the control signal being applied to the control terminal thereof to connect the input terminal of the active element to the power terminal. The oscillator control circuit also includes a control switch with one terminal connected to the control terminals of the feedback and inverter switches and another terminal connected to the power supply. The control switch is closed to apply the control signal which renders the feedback switch nonconductive and the inverter switch conductive to thereby disable the oscillator. The control switch is opened to enable the oscillator. Thus, there is no switch connected between the power supply and the active element to cause an undesired voltage drop of the power supply voltage. Moreover, since the control switch is opened to activate the oscillator, it can be of lower quality than if it were closed to activate the oscillator and it does not connect unwanted reactance to the oscillator. Moreover, the feedback and inverter control switches isolate the control switch from the oscillator.

DETAILED DESCRIPTION OF A PREFERRED EMBODIMENT OF THE INVENTION

Figure 1:
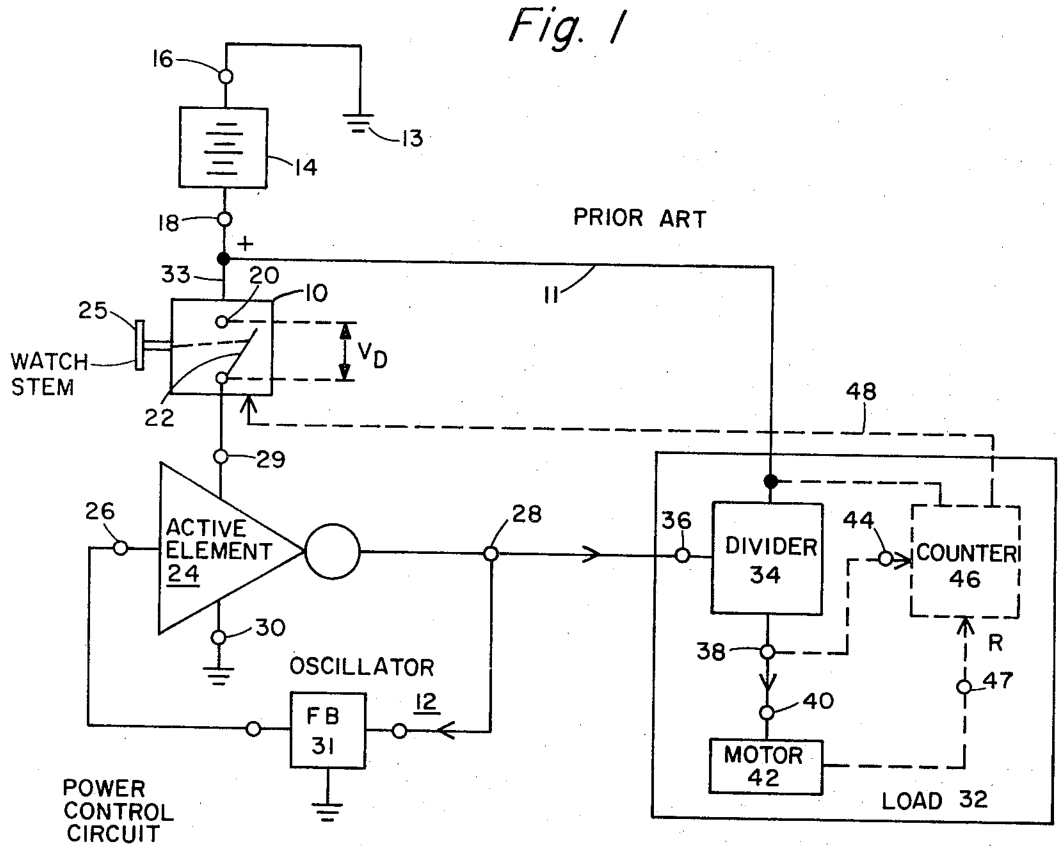
FIG. 1 is a block diagram of a prior art mechanism for controlling power flow to an oscillator.

FIG. 1 illustrates a prior art circuit including switch 10 for controlling electrical power flow between oscillator 12 and battery 14 to thereby control the operation of oscillator 12 and thus the discharge of battery 14. It is desirable in some applications such as electrical horologic instruments having MOS circuitry that battery 14 provide a supply voltage between terminals 16 and 18 thereof having a low magnitude which may be on the order of 1.5 volts. Conductor 11 is connected to positive battery terminal 18 and conductor 13 is connected to negative battery terminal 16. Switch 10 may be a mechanical switch including a fixed contact 20 and a movable contact 22 which are in the power circuit between oscillator 12 and battery 14. Oscillator 12 includes active element 24 having signal input terminal 26, signal output terminal 28, and power terminals 29 and 30. Feedback circuit 31 connects output terminal 28 to input terminal 26 to provide positive feedback causing oscillator 12 to oscillate and to provide a periodic signal at output terminal 28.

Contacts 20 and 22 of switch 10 may be opened and closed by operation of stem 25 of an electrical wristwatch, for instance, in a known manner. Switch 10 can be designed such that when stem 25 is pulled out, switch contacts 20 and 22 are forced apart so that electrical connection is not made between battery terminal 18 and power terminal 29 of active element 24 and such that when stem 25 is pushed in, switch 10 is closed to complete the conductive path from power supply terminal 18 to power terminal 29. When oscillator 12 oscillates, it provides an output signal for operating load 32 which draws power from battery 14. When oscillator 12 is inoperative, oscillator 12 and load 32, which includes MOS devices, draw only leakage current which results in insignificant discharge of battery 14.

Although the prior art power control circuit including mechanical switch 10 of FIG. 1 has been found suitable for some applications, it has many drawbacks. More specifically, electronic watches are being designed because it is believed that inexpensive solid state circuitry can be made to operate more reliably for a longer time than inexpensive mechanical devices. The attractiveness of solid state watches is diminished if such watches require high quality mechanical switches having expensive contacts and mechanisms. The prior art circuit of FIG. 1 requires that contacts 20 and 22 be closed for oscillator 12 to operate. Since oscillator 12 is normally operative over the lifetime of a watch which includes it, switch 10 must be more reliable than if it was rendered nonconductive to enable operation. Another problem with the prior art circuit of FIG. 1 is that mechanical switch 10 when closed connects the equivalent capacitance or inductance associated with lead 33, between battery terminal 18 and contact 20, to the oscillator. This somewhat unpredictable capacitance or inductance tends to complicate the design of oscillator 12 because it affects the frequency of oscillation and thus the accuracy of the horological instrument.

Furthermore, one of the most significant problems with the prior art embodiment of FIG. 1 is that whether switch 10 is mechanical or electrical, it inherently has resistance between terminals 20 and 22 even when conductive. This resistance provides a series voltage drop, $V_D$, which substracts from the already small voltage of battery 14 and thereby diminishes the potential difference applied across power terminals 29 and 30 of active element 24. As the resistance of switch 10 increases, the voltage drop, $V_D$, increases and the voltage applied across active element 24 decreases. If switch 10 is mechanical, the resistance thereof in increased by oxidation of contacts 20 and 22, by misalignment of contacts 20 and 22 and the use of inexpensive material to form contacts 20 and 22. Moreover, if switch 10 is a MOSFET, which is controlled by a voltage applied from load 32, the voltage drop across switch 10 may be on the order of 50 millivolts when fully conductive. As battery 14 ages and as oscillator 12 and load 32 drain battery 14, the output voltage amplitude thereof diminishes until it reaches about 1.25 volts at the end of the battery life. Even though the contact resistance of switch 10 only drops the power supply voltage applied to inverter 24 by millivolts, this tightens the specification which the MOS inverters of the circuit of FIG. 1 must meet and thereby decreases the yield of workable monolithic watch circuits from any given wafer.

Load 32 may include a divider circuit 34 having an input terminal 36 connected to output terminal 28 of oscillator 12 and an output terminal 38 connected to the drive terminal 40 of motor 42. Divider circuit 34 divides the repetition rate or frequency of the oscillator output signal to thereby develop a signal at output terminal 38 which is suitable for driving the motor 42. Moreover, input terminal 44 of counter 46 is connected to output terminal 38 of divider 34 and reset terminal 47 of counter 46 is connected to a switch driven by motor 42. Counter 46 provides a control signal through conductor 48 for controlling power control switch 10 as disclosed in the aforementioned related patent application.

Figure 2:
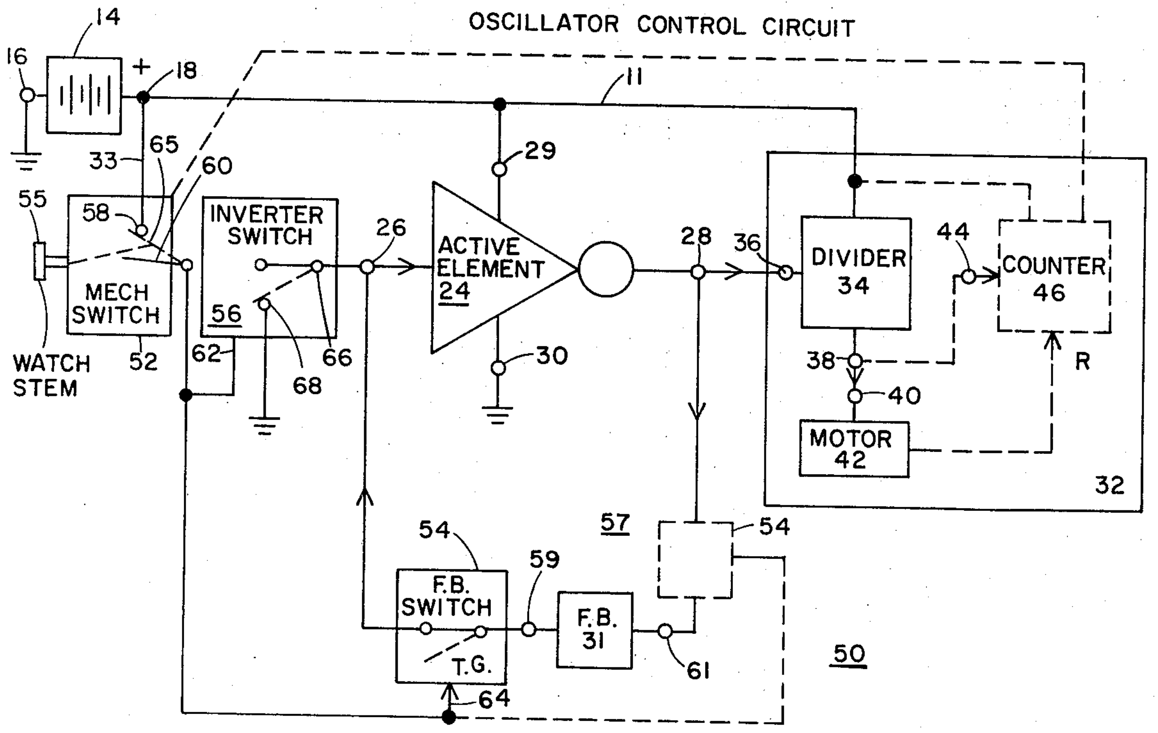
FIG. 2 is a block diagram of the oscillator control circuitry of one embodiment of the invention.

FIG. 2 is a block diagram of circuit 50 including circuitry for controlling the operation of oscillator 57 and which avoids the above-mentioned problem of the prior art circuit of FIG. 1. Common reference numbers are used in all the figures of the drawing where appropriate. The configuration of FIG. 2 includes a single-pole, single-throw mechanical switch 52, a feedback control switch 54 and an active element control switch 56. Switches 54 and 56 may be comprised of MOS devices provided in the same monolithic chip as active element 24 and load 32. Mechanical switch 52 is opened in response to watch stem 55 being pushed in to render oscillator 57 operative and is closed in response to watch stem 55 being pulled out to render oscillator 57 nonoperative. Mechanical switch 52 includes fixed contact 58 which is connected to positive supply terminal 18 of battery 14. Movable contact 60 is connected to control terminal 62 of inverter control switch 56 and to control terminal 64 of feedback control switch 54. Mechanical switch 52 can be replaced by a MOSFET operated either by load 32 or some other control circuit.

If watch stem 55 is operated to the "out" position, where it would be placed after testing of the circuit of FIG. 2 and prior to shipping, mechanical switch 52 is closed, as shown by dashed line 65 to apply the positive potential from battery 14 to control terminal 62 which causes inverter control switch 56 to be conductive between terminal 66 and terminal 68 which is connected to receive a ground potential. Thus, closure of mechanical switch 52 results in the grounding of input terminal 26 of active element 24. Also, the positive control signal is applied to control terminal 64 of feedback control switch 54 to render it nonconductive so that the feedback loop is interrupted to prevent a feedback signal from being conducted between output terminal 28 and input terminal 26 of the active element 24, and to prevent direct current (d.c.) flow between battery terminal 18 through the feedback loop and through conductive switch 56 to ground. Although feedback control switch 54 is shown to be located between input terminal 26 of active element 24 and the output terminal 59 of feedback network 31, for some applications feedback control switch 54 is better located between output terminal 28 of active element 24 and the input terminal 61 of network 31, as indicated by the placement of dashed block 54 in FIG. 2.

The oscillator control circuit of FIG. 2 has many advantages as compared to the power control circuit of FIG. 1. More specifically, since power terminal 29 of active element 24 is directly connected to positive terminal 18 of battery 14, the full magnitude of the voltage of battery 14 is applied across power terminals 29 and 30. Moreover, mechanical switch 52 can be of an inexpensive variety since it remains open during the majority of the life of the horologic instrument. Furthermore, since mechanical switch 52 is open during operation of oscillator 12, the equivalent impedance and inductance associated with and connected to lead 33 between switch terminal 58 and battery terminal 18 is not connected to active element 24 and hence does not affect the frequency of oscillation. In some applications, such as an electronic clock, line 33 is a relatively long lead on the order of inches. If mechanical switch 52 is replaced by a MOSFET, it is still desirable for lead 33 to be disconnected from oscillator 57 during operation.

Figures 3, 4:
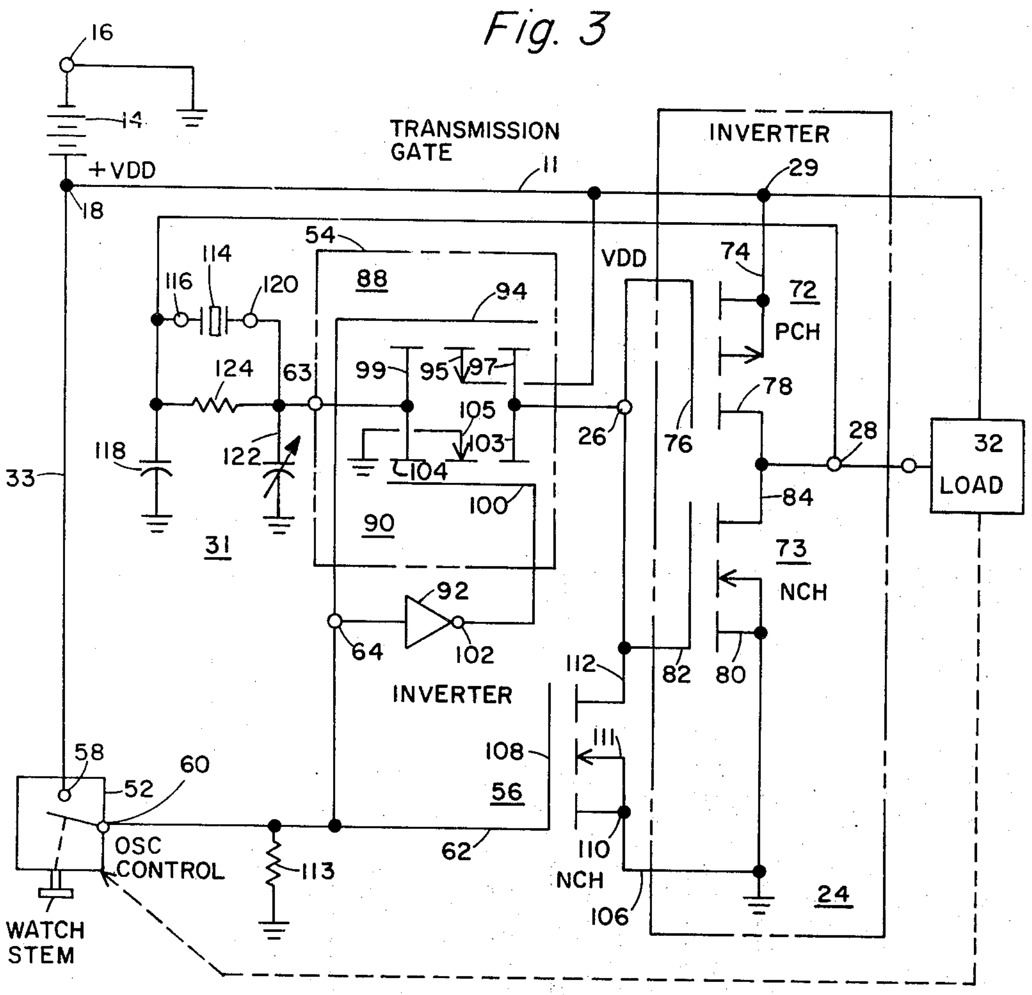
FIG. 3 is a mostly schematic diagram of the oscillator control circuit of FIG. 2.
FIG. 4 is a table illustrating the states of the switch devices of FIG. 3 which cause the oscillator to be on and which causes the oscillator to be off.

FIG. 3 is a schematic diagram of one implementation of the oscillator and oscillator control circuit of FIG. 2. Active element 24 is an MOS inverter including a P-channel MOSFET 72 and an N-channel MOSFET 73. Source electrode 74 of P-channel MOSFET 72 is connected to inverter power supply terminal 29, gate electrode 76 is connected to inverter input terminal 26 and drain electrode 78 is connected to inverter output terminal 28. Source electrode 80 of N-channel MOSFET 73 is adapted to receive a ground or reference potential, gate electrode 82 is connected to inverter input terminal 26 and drain electrode 84 is connected to inverter output terminal 28.

P-channel MOSFET 72 conducts current between its drain and source if two conditions are met. First, drain 78 must be at a negative potential with respect to source 74. Second, gate 76 must be at a negative potential with respect to the substrate which is connected to the source, and the gate-to-source substrate potential must exceed the threshold voltage of the device. N-channel MOSFET 73 also conducts current between drain 84 and source 80 only when two conditions are met. First, drain 84 must be at a positive potential with respect to source 80 which is connected to the substrate. Second, the gate-to-source or substrate potential must be positive and exceed the threshold voltage of the N-channel device. If FETs 72 and 73 are made by the silicon gate process for high operating speed and density, the threshold voltages are between .4 V and .9 V. Hence, if a logical 0 or a voltage level, which is less positive than the supply voltage by an amount exceeding the threshold of P-channel device 72, is applied to inverter input terminal 26, transistor 72 is rendered conductive and conducts the positive potential or 1 from battery 14 to output terminal 28. The logical 0 at terminal 26 insures that N-channel device 73 remains nonconductive. Alternatively, if a positive potential or 1 which exceeds the threshold voltage of N-channel device 73 is developed at input terminal 26, transistor 73 is rendered conductive and applies the ground potential or 0 to output terminal 28 of the inverter. The positive 1 should be of sufficient magnitude to insure that FET 72 is nonconductive. Thus, the logic state of the output signal of inverter 24 is "inverted" with respect to the logic state of the signal applied to the input terminal.

Feedback control switch 54 includes a P-channel MOSFET 88, N-channel MOSFET 90 and inverter 92, which has the same configuration as inverter 24 but is shown in block form in FIG. 3. Gate electrode 94 of transistor 88 is connected to control terminal 64, substrate electrode 95 is connected to power supply conductor 11, source electrode 97 is connected to inverter input terminal 26 and drain electrode 99 is connected to switch input terminal 63. Gate electrode 100 of N-channel transistor 90 is connected to output terminal 102 of inverter 92, drain electrode 103 is connected to input terminal 26 of inverter 24, source electrode 104 is connected to switch input terminal 63 and substrate electrode 105 is connected to the reference terminal.

If a 0 is applied to control terminal 64 of feedback control switch 54, P-channel FET 88 is rendered conductive. Moreover, inverter 92 inverts the 0 to provide a positive or 1 signal state at output terminal 102. Hence, N-channel device 90 is also rendered conductive by the positive voltage occurring at output terminal 102. Thus, transmission gate 54 conducts in response to the opening of control switch 52, as indicated in the third column of the table of FIG. 4. Alternatively, if a 1 is applied to transmission gate control terminal 64, then P-channel MOSFET 88 and N-channel MOSFET 90 are rendered nonconductive to "open" the transmission gate, as also indicated in the third column of the table of FIG. 4.

Inverter switch 56 includes N-channel MOSFET 106 having a gate electrode 108 connected to terminal 60 of mechanical switch 52, source and substrate electrodes 110 and 111 connected to a reference supply terminal and drain electrode 112 connected to gate 82 of N-channel inverter MOSFET 73. As indicated in column 4 of the table of FIG. 4, N-channel inverter switch 56 is rendered conductive in response to a 1 supplied to gate 108 by the closure of switch 52 and nonconductive by the 0 applied to its gate electrode by the opening of switch 52. Resistor 113, which may have a value on the order of $1 \times 10^9$ ohms, connects gate electrode 108 to the ground terminal.

Feedback circuit 31 for the oscillator of FIG. 3 includes piezoelectric crystal 114 having a first terminal 116 which is connected to the ground terminal through capacitor 118. Crystal 114 has a second terminal 120 which is connected to the ground terminal through second capacitor 122. Resistor 124 connects inverter output terminal 28 to transmission gate input terminal 63.

The oscillator of FIG. 3 is rendered inoperative so that virtually no power is drawn from battery 14 by load 32 and by the oscillator circuit when mechanical switch 52 is operated to its conductive position. The positive voltage applied through conductive switch 52 to control terminals 62 and 64 renders feedback control switch 54 nonconductive and N-channel FET 106 conductive. Hence, the ground or reference potential is applied through N-channel FET 106 to insure that N-channel inverter FET 73 is rendered nonconductive so that inverter 24 is rendered inoperative. Feedback control switch 54 must be rendered nonconductive to prevent current from flowing from battery terminal 18 through conductor 11, between the source and drain of P-channel device 72, through resistor 124 and then through conductive inverter control switch 56 to ground. Load 32 is designed such that it likewise does not provide a path to ground for the positive voltage conducted to output terminal 28 by conductive FET 72 when the oscillator is off.

Although rendering transmission gate 54 nonconductive is sufficient to prevent oscillation, it is possible that if inverter control switch 56 was not included, both P-channel FET 72 and N-channel FET 73 could be left in a conductive state and thereby drain battery 14. Thus, inverter control switch 56 is essential to insure that N-channel transistor 73 is in the off condition when the oscillator is inoperative.

As previously explained, mechanical switch 58 is operated to its nonconductive position when it is desired to activate the oscillator. As a result, inverter control switch 56 is rendered nonconductive and feedback control switch 54 is rendered conductive by a 0 applied through resistor 113. At the initial instant in time after the opening of mechanical switch 52 and after feedback circuit 31 begins conducting power through switch 54, capacitors 118 and 122 are both discharged. Hence, capacitor 122 applies a 0 through switch 54 to inverter control terminal 26 which renders P-channel FET 72 conductive. As a result, current flows through FET 72 and biasing resistor 124 to charge capacitors 118 and 122. Since resistor 124 may have a high resistance, for instance in excess of 20 megohms, the voltage on capacitor 122 will rise more slowly than the voltage on capacitor 118. Eventually, the voltage on capacitor 122 will become positive enough to cause P-channel FET 72 to turn off and N-channel FET 23 to turn on. There is an instant in the cycle of operation of the oscillator when both P-channel FET 72 and N-channel FET 73 are conductive to prevent cross over distortion. N-channel device 73 will then discharge capacitor 122 until the voltage at inverter input terminal 26 falls near the threshold of device 73 which also causes P-channel device 72 to become conductive. Thus, the output voltage at oscillator output terminal 28 varies between the 1 and the 0 states at a frequency which is a function of the dimensions of crystal 114 which controls its resonant frequency. Capacitors 118 and 122 facilitate turn on and work in cooperation with crystal 114 to form a composite feedback circuit which determines the frequency of oscillation. Since both capacitors 118 and 122 are in the feedback loop, either of them can be made variable to provide adjustment of the frequency of oscillation. Resistor 124 must be a high value so as to not reduce the frequency stability of the oscillator. The oscillator output signal at terminal 28 is of a periodic nature which may resemble either a sine wave or a square wave or a combination of these two waveforms. As previously mentioned, load 32 is driven by the oscillatory signal at the output terminal 28 and may provide a control signal to switch 52.

What has been described, therefore, is an improved mechanism for activating and inactivating an oscillator circuit having a MOS inverter and which operates at a power supply voltage of small magnitude. The oscillator control mechanism includes a solid state portion comprised of inverter and feedback switches which are suitable for being included in the monolithic chip which includes the oscillator. The oscillator control mechanism also includes a single-pole, single-throw mechanical or electrical control switch which is simple in design. This control switch selectively provides a conductive path between battery terminal 18, which may be connected to the watch case, and the feedback and inverter control switches. Since the control switch is opened to render the inverter operative, the contacts thereof need not be of high quality and undesirable contact resistance and reactive effects are not transferred to the oscillator while it is operating. The FETs of the feedback and inverter control switches tend to isolate the open control switch from the oscillator.

Moreover, since the mechanical switch is opened to render the oscillator operative and closed to render the oscillator inoperative, the contacts and mechanism thereof can be of inexpensive construction. None of the described embodiments of the oscillator control mechanisms of the invention require that a mechanical or electrical switch be connected between the power supply and oscillator terminals. Although the invention has been described in the environment of the electrical wristwatch, it will be apparent to those skilled in the art that the oscillator control mechanism could also be employed in many other applications utilizing an MOS inverter circuit which is connected to a power supply providing a voltage of minimum magnitude.

I claim:

1. In an oscillator circuit having an active element with input, output and power terminals, a feedback circuit connected between the output and input terminals of the active element and power supply means for providing electrical power and which is connected to the power terminals of the oscillator circuit, an oscillator control circuit including in combination:

normally conductive first switch means having first, second and control terminals, said first and second terminals being interposed in the feedback circuit, said first switch means being rendered nonconductive in response to a first control signal applied to said control terminal thereof to open circuit the feedback circuit;

normally nonconductive second switch means having first, second and control terminals, said first terminal being coupled to the input terminal of the active element and said second terminal being coupled to one of the power terminals, said second switch means being rendered conductive in response to said first control signal being applied to said control terminal thereof to connect the input terminal of the active element to said one of the power terminals; and control circuit means having an output terminal connected to said control terminals of said first and second switch means for applying said first control signal thereto to render said first switch means nonconductive and said second switch means conductive to thereby disable the oscillator.

2. The combination of claim 1 wherein said first switch means includes a transmission gate having first and second field effect transistor means of opposite conductivity types.

3. The combination of claim 1 wherein said second switch means includes field effect transistor means having a first electrode connected to the input terminal of the active element, a second electrode connected to said one of the power supply terminals and a control electrode connected to said output terminal of said control circuit means.

4. The combination of claim 1 wherein said control circuit means includes mechanical switch means.

5. A controlled oscillator circuit including in combination:

first conductive means for applying a power supply potential of a first magnitude;

second conductive means for applying a power supply potential of a second magnitude;

active element means having a first power terminal connected to said first conductive means, a second power terminal connected to said second conductive means, and input and output terminals;

first switch means having first, second and control terminals, said first switch means being rendered conductive between said first and second terminals thereof in response to a first control signal and nonconductive in response to a second control signal;

feedback circuit means coupling said output terminal of said active element means through said first switch means to said input terminal of said active element means;

second switch means having first, second and control terminals, said first terminal being connected to said input terminal of said active implement means, said second terminal being connected to one of said first and second conductive means, said second switch means being rendered nonconductive between said first and second terminals thereof in response to said first control signal and conductive between said first and second terminals thereof in response to said second control signal; and control circuit means having an output terminal connected to said control terminals of said first and second switch means, said control circuit means being operable to apply said first control signal to render the oscillator circuit operative and said second control signal to render the oscillator circuit inoperative.

6. The oscillator circuit of claim 5 wherein said first switch means includes:

transmission gate means having metal-oxide-semiconductor transistor means of a first conductivity type and gate, source and drain electrodes, said gate electrode being connected to said control terminal of said first switch means, said source and drain electrodes being coupled between said first and second terminals of said first switch means, and metal-oxide-semiconductor transistor means of a second conductivity type with gate, drain and source electrodes, said source and drain electrodes of said metal-oxide-semiconductor transistor means of said second conductivity type being respectively connected to said drain and source electrodes of said metal-oxide-semiconductor transistor means of said first conductivity type; and first inverter means having an input terminal connected to said control terminal of said first switch means and an output terminal connected to said gate electrode of said metal-oxide-semiconductor transistor of said second conductivity type.

7. The oscillator circuit of claim 5 wherein said active element means includes a second inverter means comprised of:

a first metal-oxide-semiconductor transistor of one conductivity type having a gate electrode connected to said input terminal of said active element means, a source electrode connected to one of said first and second conductive means and a drain electrode connected to said output terminal of said active element means; and a second metal-oxide silicon transistor of the other conductivity type having a gate electrode connected to said input terminal of said active element means, a source electrode connected to the other of said first and second conductive means and a drain electrode connected to said output terminal of said active element means.

8. The oscillator circuit of claim 5 wherein said second switch means includes a metal-oxide-semiconductor transistor means having a source electrode connected to said one of said first and second conductive means, a drain electrode connected to said input terminal of said active element means and a gate electrode connected to said control terminal of said second switch means.

9. The oscillator circuit of claim 5 wherein said control circuit means includes:

mechanical switch means having a first terminal connected to one of said first and second conductive means, a second terminal connected to said control terminals to said first and second switch means, said mechanical switch means being adapted to provide said first control signal in response to being opened and to provide said second control signal in response to being closed; and resistive means connected to said second terminal of said mechanical switch means.

* * * * *